US010217655B2

(12) United States Patent
Mushel et al.

(10) Patent No.: US 10,217,655 B2
(45) Date of Patent: Feb. 26, 2019

(54) WAFER CONTAINER WITH SHOCK CONDITION PROTECTION

(71) Applicant: ENTEGRIS, INC., Billerica, MA (US)

(72) Inventors: Ryan Mushel, Chaska, MN (US); Jason T. Steffens, Shakopee, MN (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/536,980

(22) PCT Filed: Dec. 18, 2015

(86) PCT No.: PCT/US2015/066724
§ 371 (c)(1),
(2) Date: Jun. 16, 2017

(87) PCT Pub. No.: WO2016/100843
PCT Pub. Date: Jun. 23, 2016

(65) Prior Publication Data
US 2017/0365496 A1 Dec. 21, 2017

Related U.S. Application Data

(60) Provisional application No. 62/093,908, filed on Dec. 18, 2014.

(51) Int. Cl.
H01L 21/673 (2006.01)
(52) U.S. Cl.
CPC .. H01L 21/67369 (2013.01); H01L 21/67366 (2013.01); H01L 21/67373 (2013.01); H01L 21/67383 (2013.01); H01L 21/67386 (2013.01)
(58) Field of Classification Search
CPC ......... H01L 21/67369; H01L 21/67366; H01L 21/67373; H01L 21/67383; H01L 21/67386
See application file for complete search history.

(56) References Cited

U.S. PATENT DOCUMENTS 5,207,324 A * 5/1993 Kos ................... H01L 21/67369
206/453
5,228,568 A * 7/1993 Ogino ............... H01L 21/67369
206/587

(Continued)

FOREIGN PATENT DOCUMENTS

EP 1 583 134 A2 10/2005
JP 2000-109172 A 4/2000

(Continued)

Primary Examiner — Kaitlin S Joerger
(74) Attorney, Agent, or Firm — Entegris, Inc.

(57) ABSTRACT

A front opening wafer container has a container portion and a door sized to close an open front of the container portion. The container portion has shelves for holding wafers defining a seating position and has forward and rearward wafer supports to suspend wafers therebetween in a transport position above the seating position. Shock condition cushion portions are arranged adjacent the transport position for protecting the wafers during a shock condition. The wafers may be bonded wafers having a thinned wafer side and a carrier substrate side. Wafer engagement pads and finger members extend in opposing directions from a central strip on the door providing a balance wafer engagement. When closing the door, a primary wafer support portion engages the wafers first and a secondary elastomeric wafer support engages the wafer secondly. A V-groove for receiving the wafers in the wafer supports has a greater angle defined between the V-groove and the thinned wafer side than the angle defined between the V-groove and carrier substrate side providing enhanced protection for the bonded wafers.

9 Claims, 16 Drawing Sheets

(56) References Cited

U.S. PATENT DOCUMENTS

| | | | | |
|---|---|---|---|---|
| 5,749,467 A * | 5/1998 | Gregerson | ........ | H01L 21/67369 206/445 |
| 5,782,362 A | 7/1998 | Ohori | | |
| 6,267,245 B1 | 7/2001 | Bores et al. | | |
| 7,017,749 B2 * | 3/2006 | Yajima | .............. | H01L 21/67369 206/454 |
| 7,316,315 B2 * | 1/2008 | Matsutori | ......... | H01L 21/67369 206/454 |
| 7,748,539 B2 * | 7/2010 | Onda | ................ | H01L 21/67369 206/521 |
| 7,967,147 B2 * | 6/2011 | Mimura | ............ | H01L 21/67369 206/454 |
| 8,118,169 B2 * | 2/2012 | Hosoi | ............... | H01L 21/67369 206/454 |
| 8,910,792 B2 * | 12/2014 | Nagashima | ....... | H01L 21/67383 206/454 |
| 9,472,431 B2 * | 10/2016 | Gregerson | ........ | H01L 21/67369 |
| 9,478,450 B2 * | 10/2016 | Raschke | ........... | H01L 21/67369 |
| 9,633,877 B2 * | 4/2017 | Gregerson | ........ | H01L 21/67369 |
| 9,831,129 B2 * | 11/2017 | Shimanuki | ............ | H01L 21/561 |
| 2003/0221985 A1 | 12/2003 | Yajima et al. | | |
| 2007/0272590 A1 * | 11/2007 | Tseng | ................ | H01L 21/67356 206/725 |
| 2007/0295638 A1 | 12/2007 | Nakatogawa | | |
| 2011/0000817 A1 | 1/2011 | Hosoi et al. | | |
| 2013/0299384 A1 * | 11/2013 | Fuller | ............... | H01L 21/67369 206/711 |
| 2014/0197068 A1 * | 7/2014 | Cho | .................. | H01L 21/67369 206/711 |
| 2016/0218027 A1 * | 7/2016 | Pylant | ............... | H01L 21/67369 |
| 2017/0294327 A1 * | 10/2017 | Gregerson | ........ | H01L 21/67386 |

FOREIGN PATENT DOCUMENTS

| | | |
|---|---|---|
| JP | 2004-111830 A | 4/2004 |
| JP | 2010-199189 A | 9/2010 |
| JP | 2011-131940 A | 7/2011 |
| JP | 2013-118511 A | 6/2013 |
| WO | 2016/100843 A1 | 6/2016 |

* cited by examiner

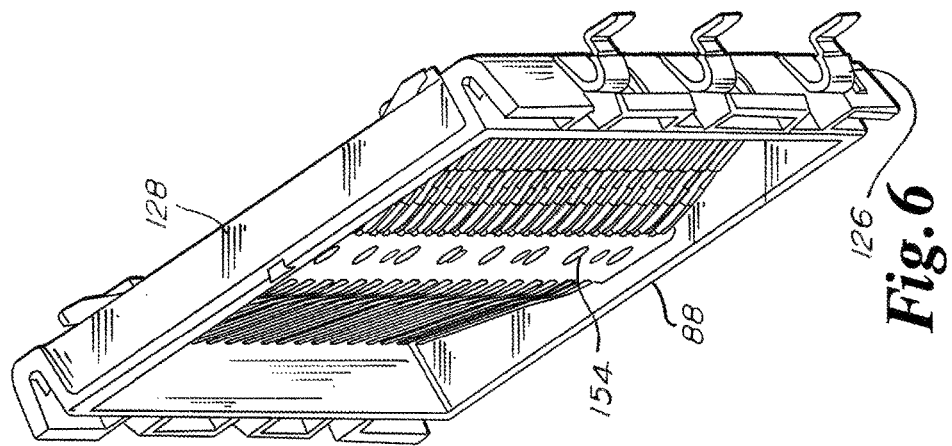
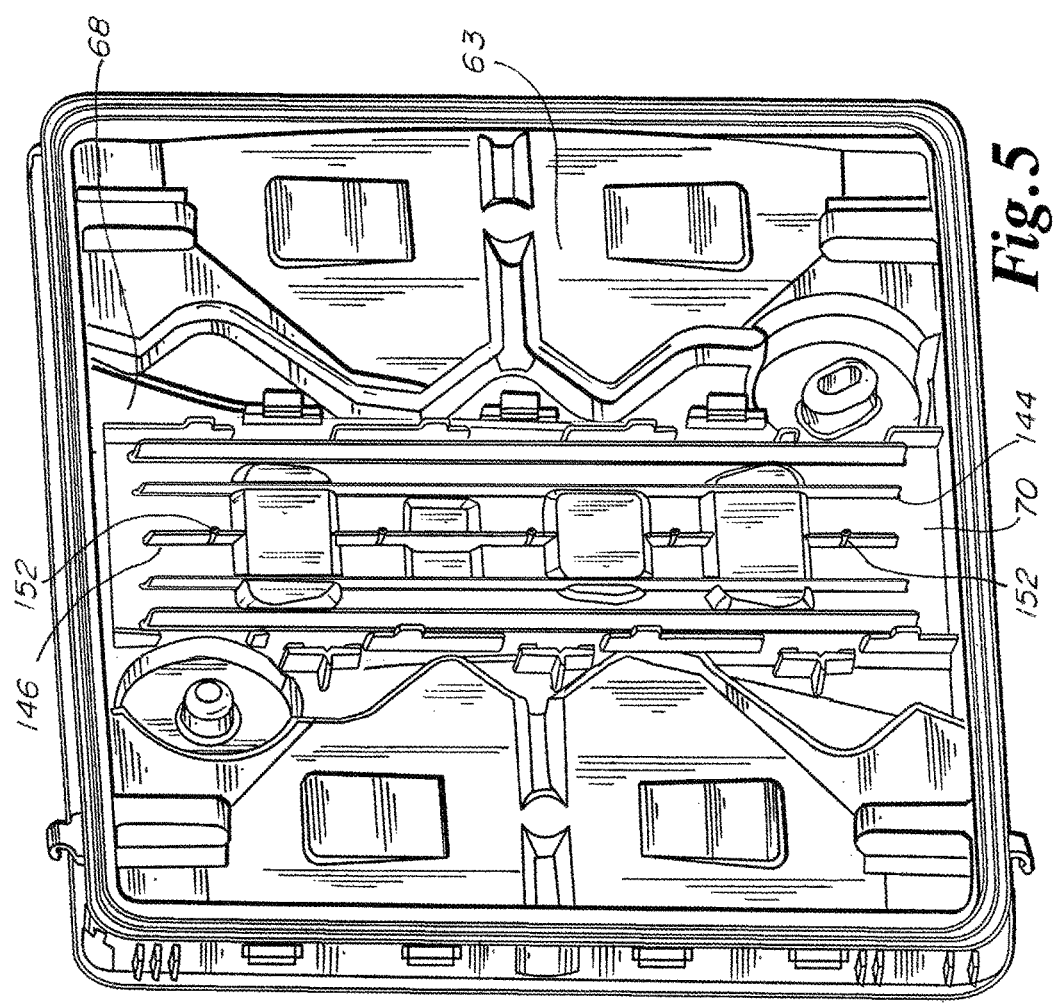

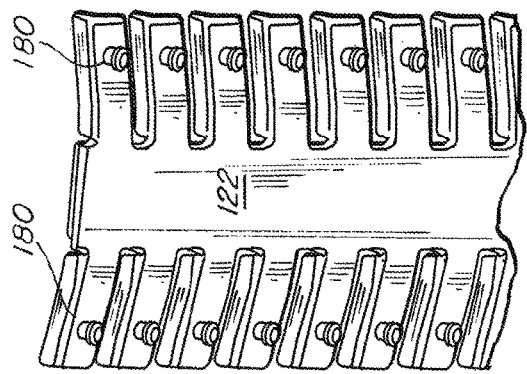
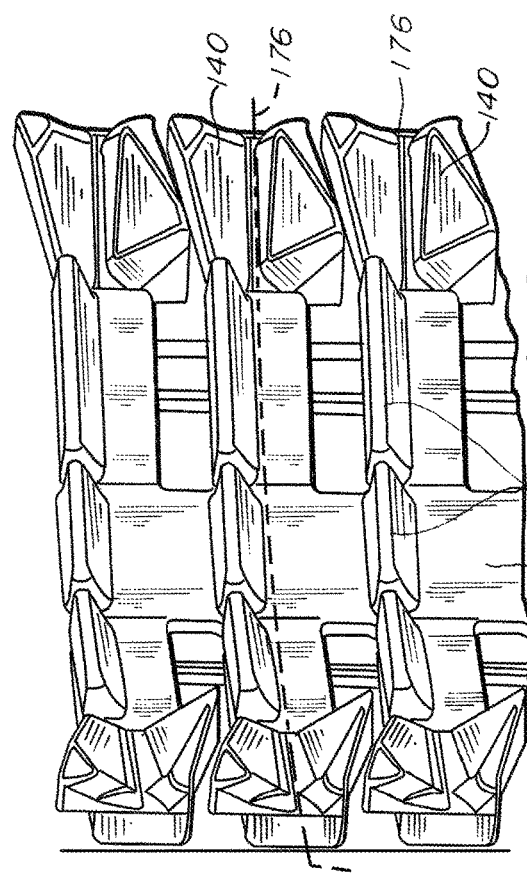
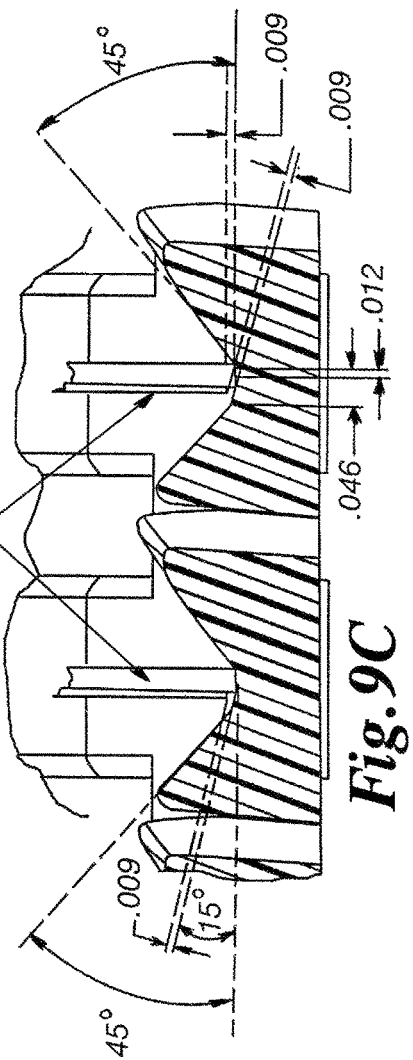
*Fig. 9B*
*Fig. 9C*
*Fig. 9D*

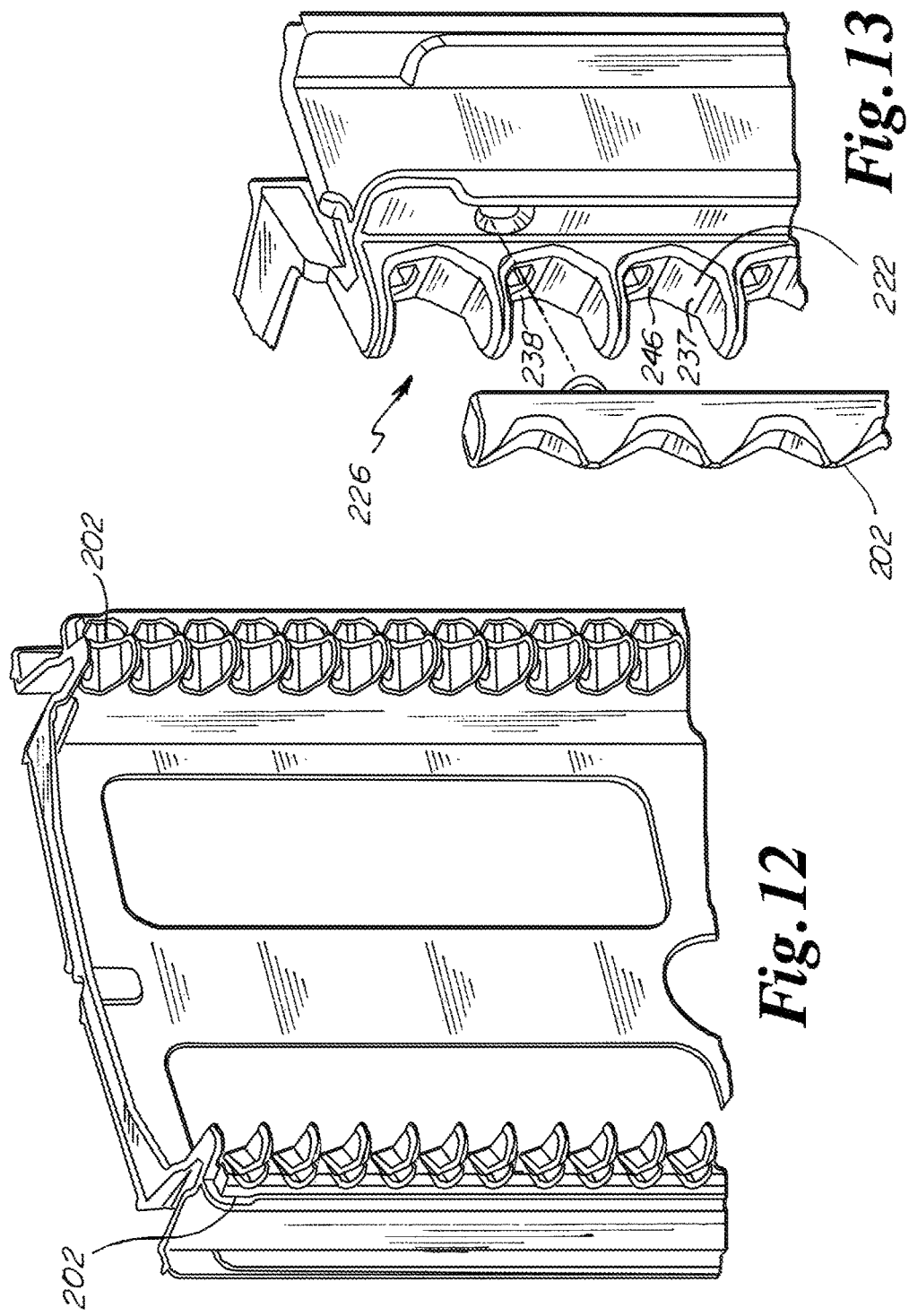

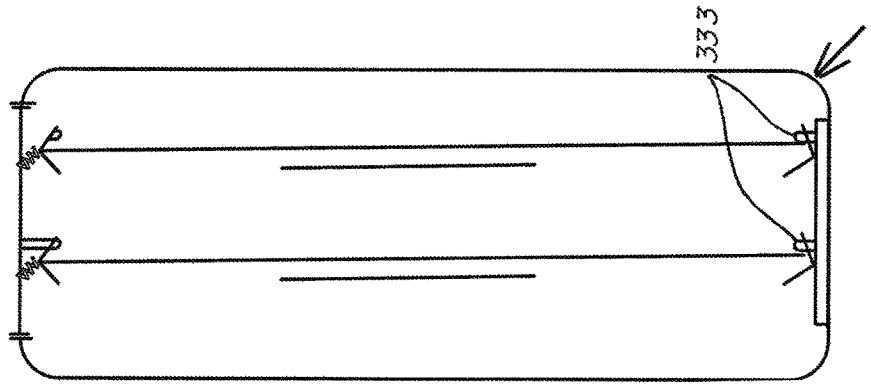
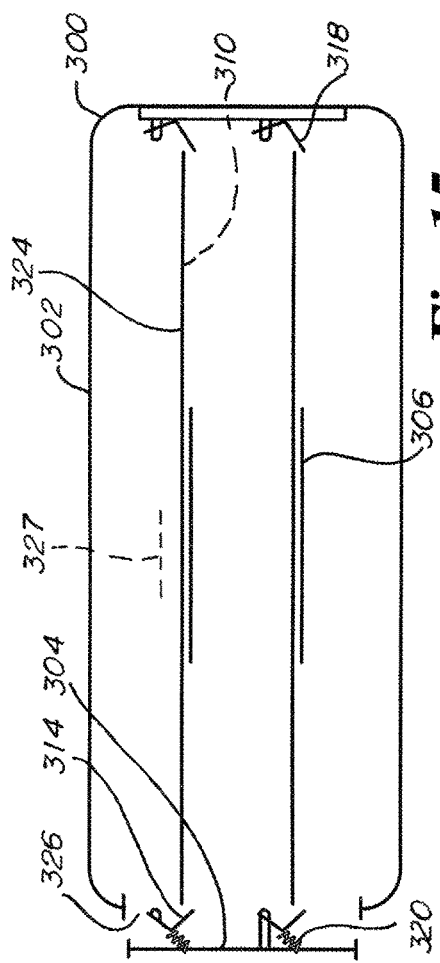
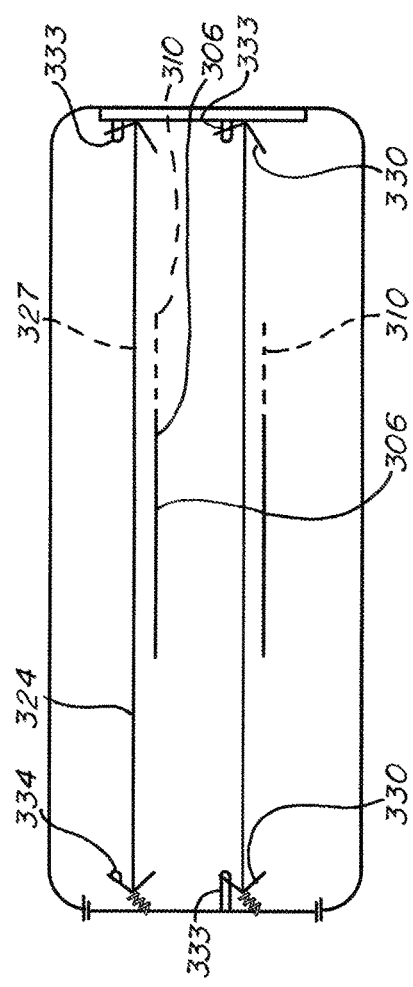

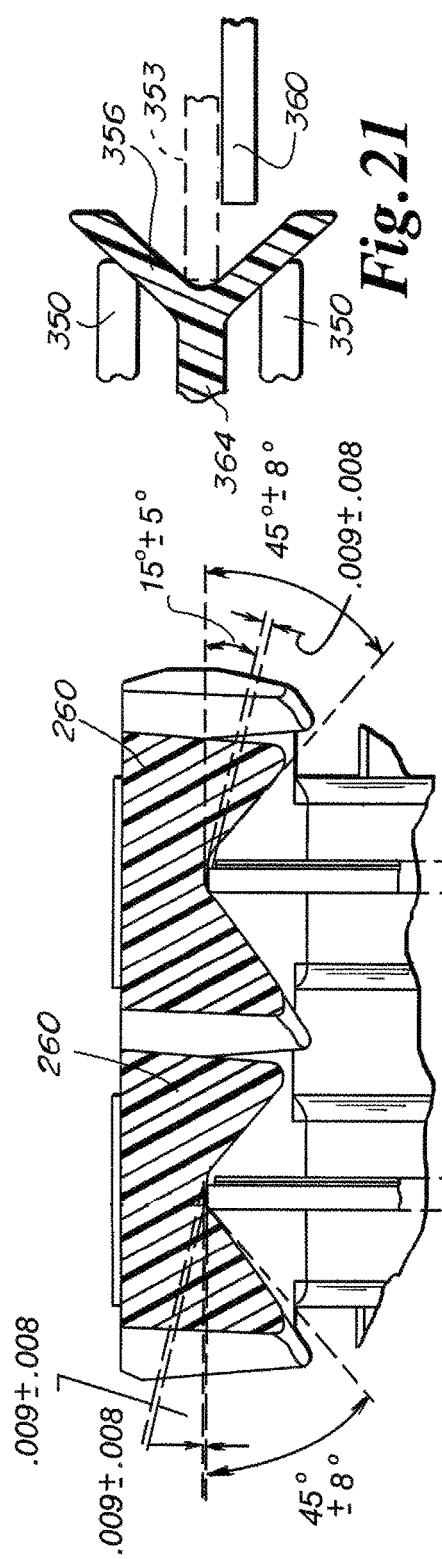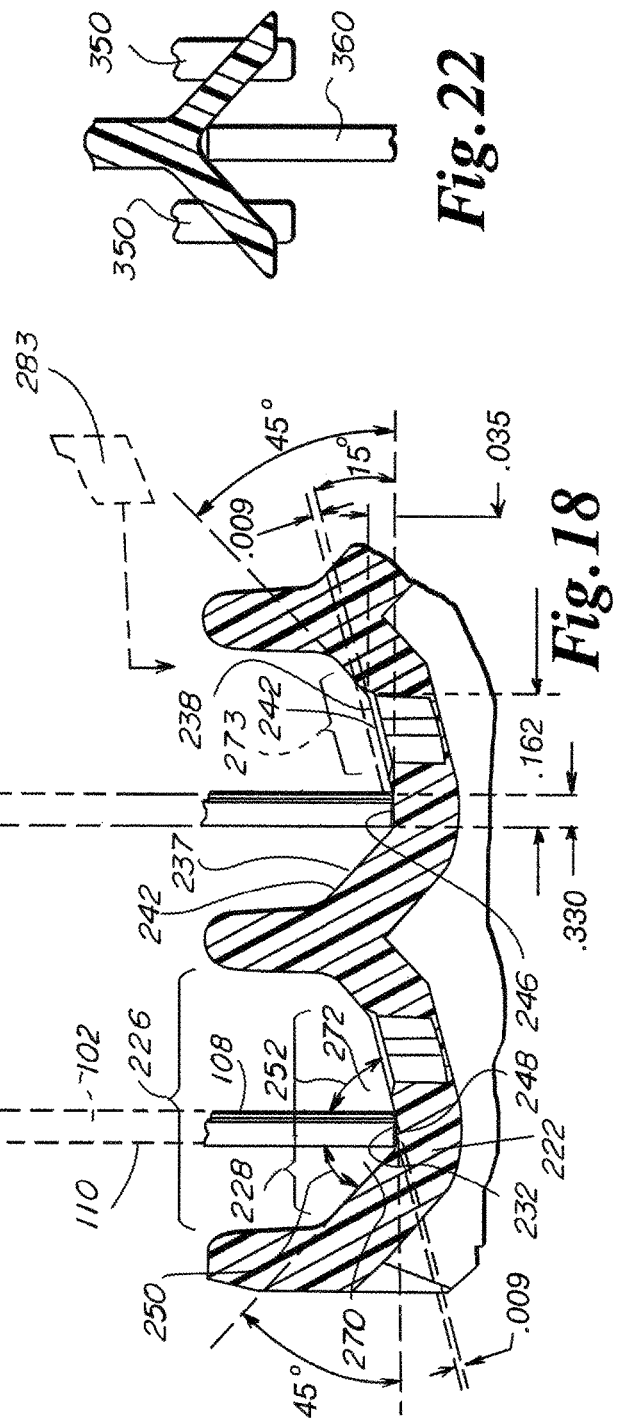

WAFER CONTAINER WITH SHOCK CONDITION PROTECTION

RELATED APPLICATIONS

This application claims priority to U.S. Provisional Application No. 62/093,908 filed Dec. 18, 2014, the disclosure of which is hereby incorporated by reference herein in its entirety.

BACKGROUND OF THE INVENTION

Semiconductor wafers are processed into integrated circuit chips. Wafer containers hold wafers during transport from the original manufacture of the wafers to fabrication facilities, and in between processing steps in the fabrication facilities. The wafers go through dozens or hundreds of processing steps to the final integrated circuit product. The wafers are extremely fragile and expensive. The more processing steps that wafers have undergone, the greater the investment, the greater the value in the wafers, and the greater the loss if damaged.

Wafers may be of various sizes up to 300 mm in diameter and development of equipment for 450 mm wafers is being developed. These containers are required to protect the wafers from contaminants and damage, both during transport of the containers with the wafers, and during loading and unloading steps of the wafers, and during closure of the wafers. The wafers are generally supported in containers that support the wafers only by their edges. Wafer containers, particularly for 300 mm wafers are known as FOUPS and FOSBS, acronyms for "front opening unified pod" and "front opening shipping box". These front opening containers have a front opening container portion and a door that closes the front opening and latches onto the container portion. The wafers are supported by shelves in the container portion positioned at the two sides of the container. The wafers are also supported forwardly and rearwardly by wafer supports (also termed wafer restraints) in which the wafer edges seat in V-shaped or U-shaped recesses in the forward and rearward supports with the supports providing a compressive force on the forward and rearward edge. The wafer supports may be cushions that have thin polymer springs connecting to wafer edge engagement portions for providing resilient support of the wafer edges. In FOUPS, the wafers will typically be elevated off of the shelves and supported only by the forward and rearward supports during shipment. The wafer edge engagement portions are "spring supported". By industry convention, an x-y-z coordinate system is applied to FOUPS and FOSBS with the insertion and retraction direction being associated with the z direction, the vertical direction being associated with the x direction, and lateral, left and right directions being associated with the y direction. FOSBS may be rotated 90 degrees rearwardly for shipping with the wafers suspended vertically between the front and rearward wafer supports and the coordinate systems rotates with the FOSBS.

Demand from consumers and product manufacturers, as well as manufacturing cost efficiencies, have driven downwardly the size and thickness of integrated circuits. This is reflected at the wafer processing level by increased "circuit density" and reduced thicknesses. the reduced thicknesses, particularly in large wafer sizes, such as 300 mm, equates to greater demands on protecting the wafers particularly during transportation of the loaded wafer container. For example, the thinner wafers will deflect more than thicker wafers during shock conditions and have a greater fragility. This creates greater demands of the forward and rearward supports. For example, they may need greater range of movement and toward and away from the wafer (z direction) and more delicate support, which includes less compressive force on the wafer.

Generally, improvements in the capability of forward and/or rearward wafer supports to effectively support thinner wafers in front opening wafer containers would be well received.

Most recently, very thin wafers that are not capable of effectively supporting themselves are bonded to a carrier substrate so that the very thin wafers can be processed and handled. The "bonded wafer" thus has a carrier substrate side and face and a thinned wafer side and face. In such bonded wafers, the very thin wafer is eventually separated from the carrier substrate before being finally transformed into the integrated circuits. The carrier substrate may be supported by its edge with the thinned wafer edge offset inwardly from the carrier substrate edge. Forward and/or rearward wafer supports configured particularly to support and protect these bonded wafers are needed.

SUMMARY OF THE INVENTION

A front opening wafer container includes a container portion and a door portion, the container portion having interior shelves and a rearward wafer edge support at a back wall. The front door sized to be received in the open front and latched to the container portion and having a forward wafer support whereby the wafers are compressively engaged between the forward and rearward wafer supports, each wafer support with V-shaped recesses. The forward wafer supports comprising a wafer edge engagement portion supported by a spring member, the spring member connecting to a base portion that attaches to the inside surface of the front door. The forward wafer support providing a compressive force on the wafers in the container when the door is latched onto the container portion whereby the wafers are retained within the V-shaped recesses at a primary seating position in a first wafer edge engagement portion formed of a first polymer. A second wafer engagement portion formed of a second polymer is offset axially and/or circumferentially from the seating location whereby it is engaged only in a shock condition or event. In embodiments the second polymer is softer that the first polymer and is a shock condition cushion. The shock condition cushion may be an elastomeric material. The front opening container may be a "FOSB" such that after wafers are loaded horizontally, the door is applied and latched, and the container is rotated rearwardly 90 degrees, such that the wafers are oriented vertically, for shipping.

In embodiments particularly suited for bonded wafers, the wafer edge engagement portion defining a recess and having a primary seating position located at the bottommost region of the recess and a second shock event engagement portion displaced from the primary seating position formed of a material softer than the material at the primary position. In embodiments of the invention, the V-shaped forward or rearward wafer support having a first surface forming a first angle with the carrier substrate side and a second angle with the thinned wafer side of the bonded wafer. The second angle being greater than the first angle. In embodiments, the wafer edge receiving recess has, in an end or cross sectional view, four legs, each leg corresponding with a surface or face of the recess. The wafer edge receiving recess having a first leg facing the carrier substrate face, the first leg connecting to a second leg with the juncture defining a deepest most receiving region, the second leg facing the thinned wafer face and third leg connecting to the second leg and also facing the thinned wafer face, the juncture of the second and third leg defining a shock event limit region. In embodiments, the rearward wafer support has two columns of wafer engagement portions with the wafer edge receiving recess with the four legs (and faces). In embodiments, the wafer edge receiving portions are not sprung on fingers, that is, the receiving portions are not supported by discrete spring members for each wafer engagement portion.

In embodiments, a wafer container with a plurality of wafer engagement portions each with a first face and a second face are connected at a juncture to define a wafer edge receiving recess for a bonded wafer, the bonded wafer having a carrier substrate side surface and a thinned wafer side surface, when the bonded wafer is seated in the wafer edge receiving recess, the first face and the carrier substrate side surface defining a first converging region and the second face and thinned wafer side surface defining a second converging region. The first converging region being "sharper" and "narrower" than the second converging region. The second converging region being more "blunt" and "wider" than the first converging region. The wafer engagement portions may be formed of rigid polymers such as polycarbonate.

In embodiments, a bonded wafer container with a plurality of wafer engagement portions each with a recess having a first and second margin of the recess, with each first margin facing a substrate carrier side of a wafer received in the recess, and the second margin facing a thinned wafer side of the recess, the wafer edge receiving portion positioned, elevation wise to be closer to the first margin that the second margin thereby providing greater clearance for the thinned wafer side of the bonded wafer in a shock condition. In embodiments, a plurality of secondary wafer engagement portions configured as shock condition wafer engagement portions are provided outside a normal seating region to engage the bonded wafer in a shock condition. In embodiments, the secondary wafer engagement portions provide an elastomeric engagement with the bonded wafer.

In embodiments of the invention, a front opening wafer container has shock condition wafer engagement portions that are axially displaced from a wafer seating position. In embodiments of the invention, a front opening wafer container has shock condition wafer engagement portions that do not engagement the wafers except in a shock condition. In embodiments of the invention, a front opening wafer container has shock condition wafer engagement portions that are spring finger supported. In embodiments of the invention, a front opening wafer container has shock condition wafer engagement portions that are elastomeric. In embodiments of the invention, a front opening wafer container has shock condition wafer engagement portions and their associated respective primary engagement portions are formed by overmolding, one on the other. In embodiments of the invention, the shock condition In embodiments of the invention, a wafer container with a forward wafer support has a central base strip with opposing pairs of cantilevered spring finger portions extending outwardly toward the wafers and laterally toward the sides of the wafer container, each spring finger portion connecting and unitary with a wafer edge receiving portion configured as a pad. In embodiments, a central strip of elastomeric material extends downwardly on the central base strip with a plurality of inward projections extending toward the central interior of the container portion and extend over faces of wafers engaged by the forward wafer support, the plurality of projections positioned to not engage the wafers except in a shock condition. In embodiments, the wafers are bonded wafers with a thinned wafer side and the projection extends over the thinned wafer side.

A wafer container having a container portion with an open front and a door for closing the open front, the wafer container having a forward or rearward wafer support with a plurality of wafer edge engagement portions that each define a static wafer seating position for one of the wafers. An additional plurality of secondary wafer shock event engagement portions are positioned outside the static wafer seating position to engage the wafers only in a shock condition. In embodiments the secondary wafer shock engagement portions are elastomeric. In embodiments, the secondary wafer shock engagement portions are part of a strip extending along a length of the forward or rearward wafer support. In embodiments the secondary wafer shock engagement portions are projections extending in a direction inwardly.

In embodiments a wafer container for bonded wafers has forward or rearward wafer support that has a first wafer support with a bonded wafer edge receiving portions with a recess that receives the edge of the bonded wafer, the wafer container further has secondary wafer support portion that has first engagement portions that engage the bonded wafer in a static condition and second engagement portions that are positioned outside of a normal wafer seating region and that contact the wafer only in a shock condition. The first and second engagement portions may be in a unitary elastomeric strip that attaches to the first wafer support.

In embodiments, when the front opening wafer shipper is loaded, wafer are installed horizontally to seat on the shelves. The door is applied and latched causing the wafers to ride up ramps on forward and rearward wafer supports to seat in wafer edge receiving recesses. In the forward support, the ramps are part of wafer edge receiving portion configured as a pad and integral with spring finger portions. As the door is applied, the wafer edges first engage the pad and the pads and respective spring finger portions deflect and then the wafer edges may engage the secondary wafer support portion configured as an elastomeric shock condition cushion. Upon engagement of the cushion the cushion deflects as the pad and spring finger portion continue to deflect. The pad deflects a distance less than the deflection of the pad and spring finger portion. The container is then rotated 90 degrees to arrange the wafers vertically.

In embodiments, a front opening wafer container has a primary wafer support portion on both the front door and the back side or wall of the container portion. The primary wafer support portion being formed of a polymer. The container also has a secondary wafer support portion at at least one of the front door and the back side of the container portion. The secondary wafer support portion attaching to the primary wafer support portion by cooperating engagement structure such as nubs and apertures. The secondary wafer support portion extending the length of the primary wafer support portion and having a series of engagement portions for each wafer. The secondary wafer support portion being formed of material softer than the primary wafer support portion polymer. In embodiments, the secondary wafer support portion being formed of elastomeric material. In embodiments, the secondary wafer support portion engages the wafers when they are in a normal seating position with a first engagement portion and engage the wafers with a second engagement portion when the wafer is under a shock condition and moves from its normal seating position. In embodiments, the wafer engages the secondary wafer support portion only in a shock condition. In other embodiments, the secondary wafer support portion may be separated from the primary wafer support portion on the front door or the back side of the container portion.

A feature and advantage of embodiments of the invention is that enhanced protection in shock conditions is provided to wafers in wafer carriers, and in particular, to bonded wafers.

DESCRIPTION OF THE FIGURES

FIG. 5 is a perspective view of the inside surface of the front door of the wafer container of FIG. 1 without forward wafer support system in place.

FIG. 6 is a perspective view of the wafer support for the door of FIG. 5.

FIG. 9B is a more detailed perspective view of the wafer support of FIG. 9A and with a wafer shown in phantom.

FIG. 9C is a cross sectional view through adjacent wafer edge engagement portions both shown engaged with bonded wafers.

FIG. 9D is a perspective view of the back side, facing away from the wafers, of a shock event wafer engagement cushion.

FIG. 12 is a front side perspective view of the rear side wafer support system with shock protection of FIG. 3.

FIG. 13 exploded perspective view of the wafer support system of FIG. 12.

FIG. 15 is a diagrammatic view of a front opening wafer container with the wafers seated on shelves and the door displaced from the front opening.

FIG. 16 is a diagrammatic view of the front opening wafer container of FIG. 15 with the front door in place—closed.

FIG. 17 is a diagrammatic view of the front opening wafer container of FIG. 15.

FIG. 18 is a cross sectional view of the forward and backward wafer supports suspending a wafer therebetween in a vertical transport orientation.

FIG. 21 is a side cross sectional view of a wafer edge engagement portion that deflects upon compressive loading of a wafer to allow shock condition cushions to be exposed to the wafer.

FIG. 22 is a cross sectional view of the wafer edge engagement portion of FIG. 19 deflected with shock cushions exposed and with the associated wafer container in a transport position with the wafers vertical.

DETAILED DESCRIPTION

Figure 1:
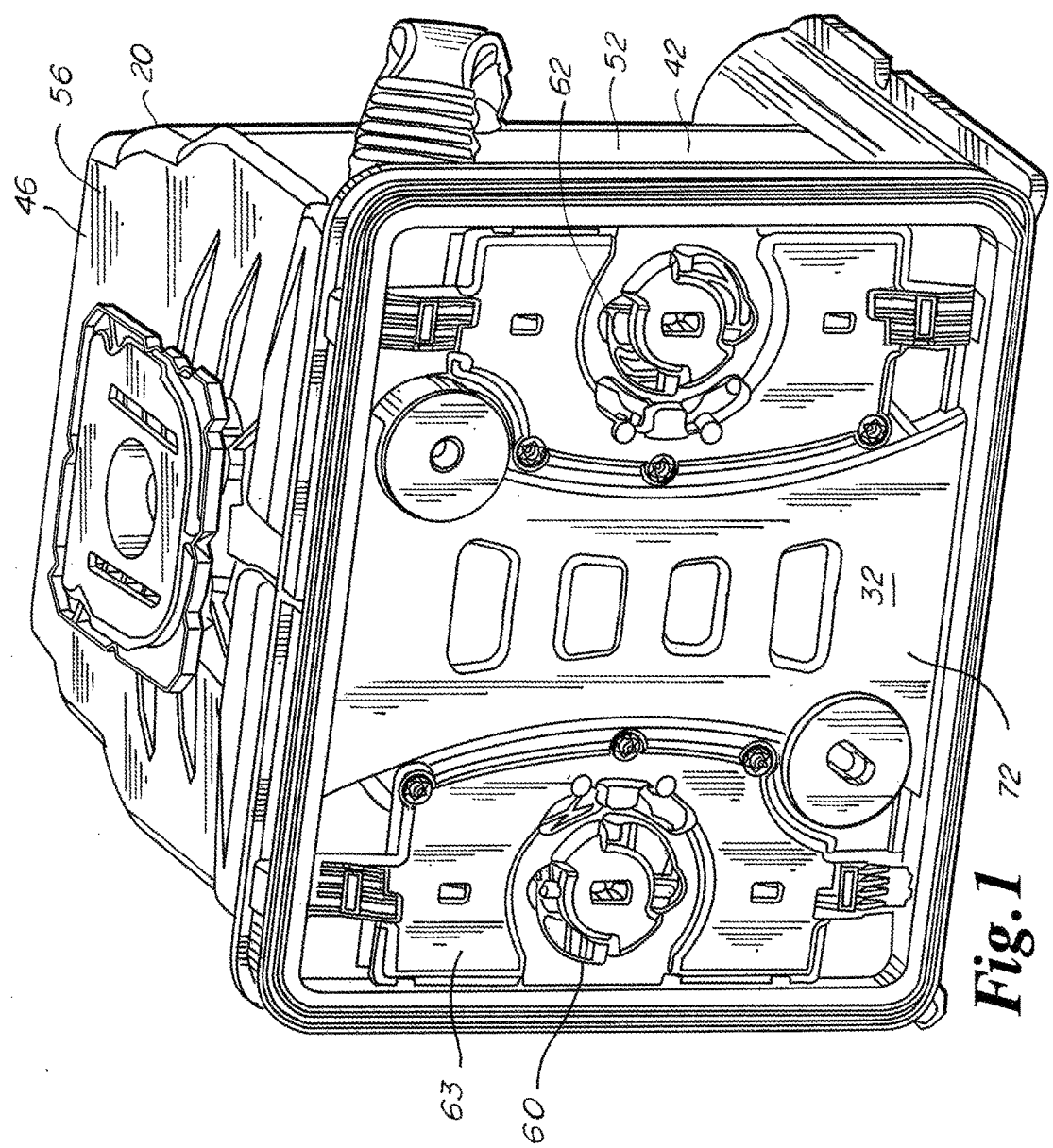
FIG. 1 is a perspective view of a 300 mm wafer container in accord with the embodiments of the invention herein.
Figure 2:
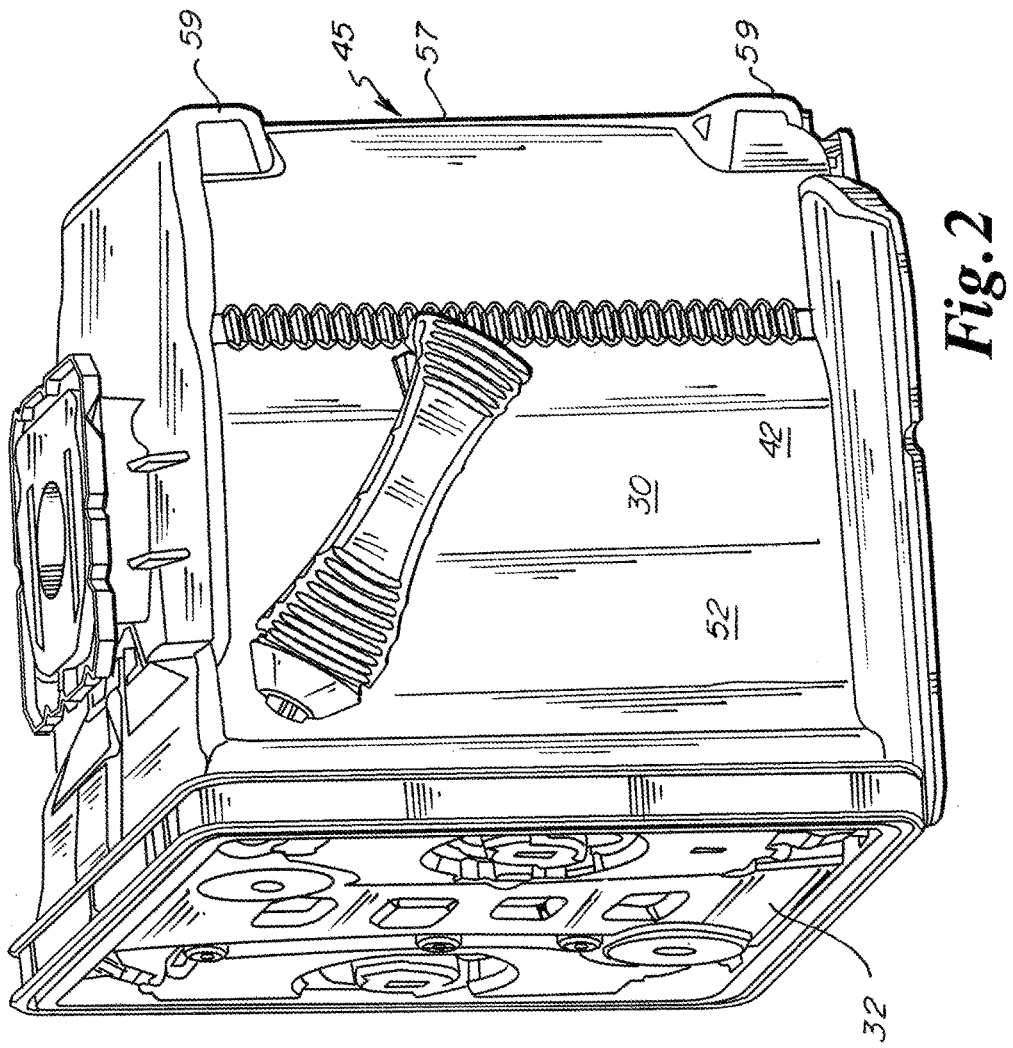
FIG. 2 is a side perspective view of the front opening wafer container of FIG. 1.
Figure 3:
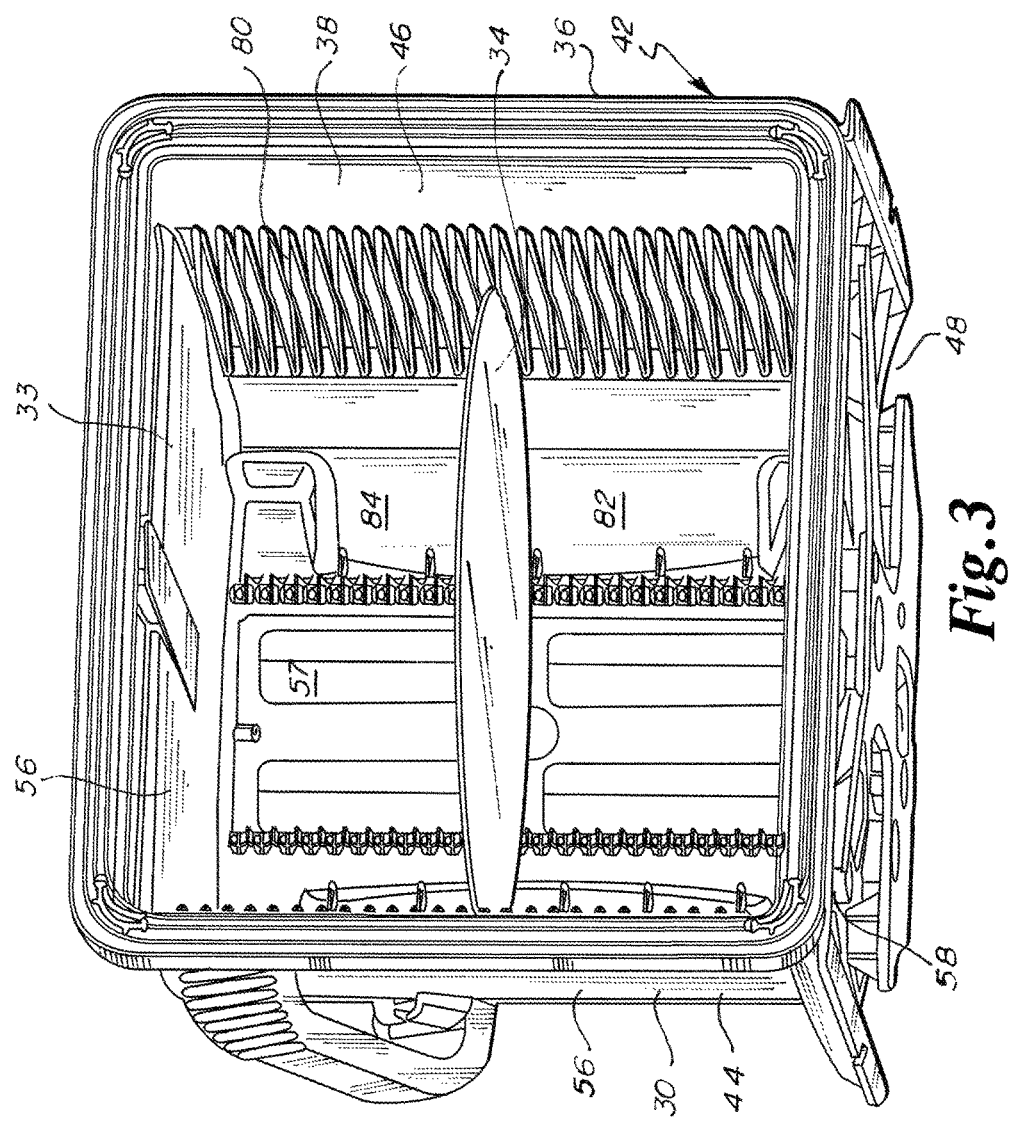
FIG. 3 is a front perspective view of the container portion of the wafer carrier of FIG. 1.
Figure 4:
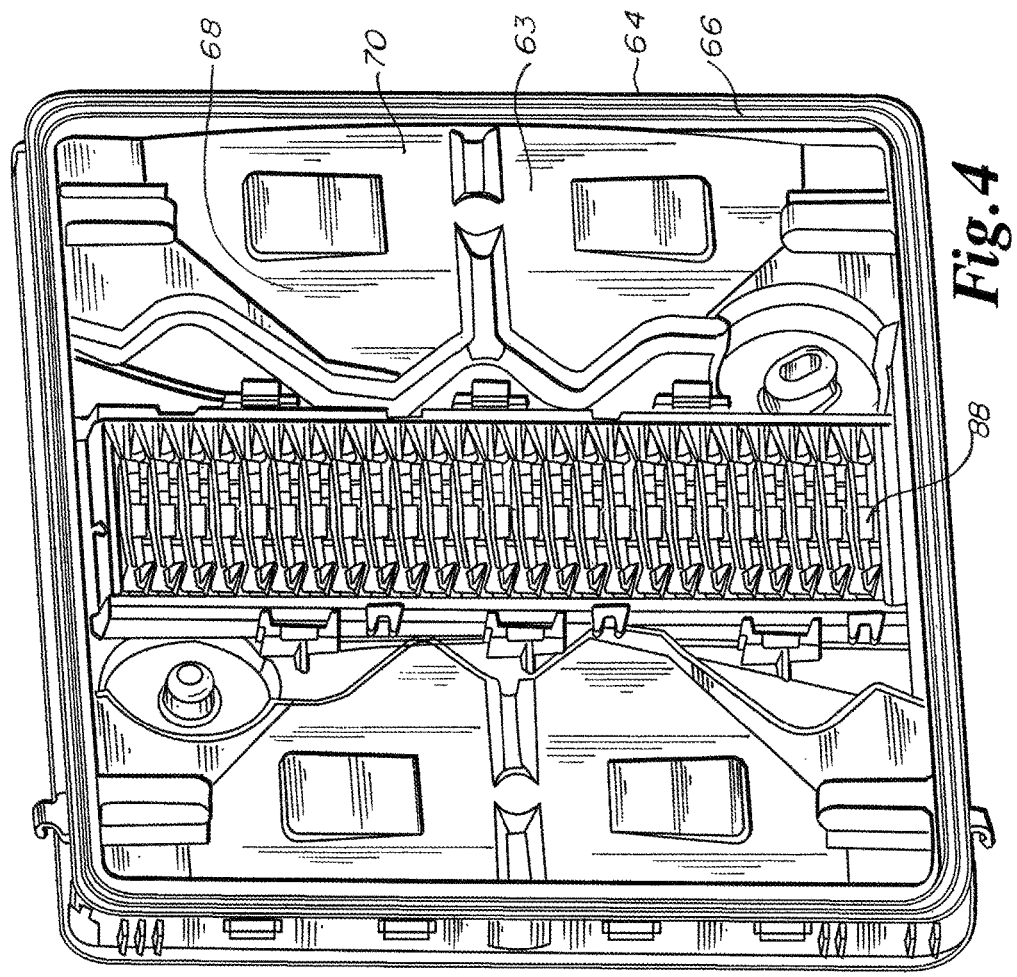
FIG. 4 is a perspective view of the inside surface of the front door of the wafer container of FIG. 1 illustrating the wafer support system with shock protection.
Figures 7, 8:
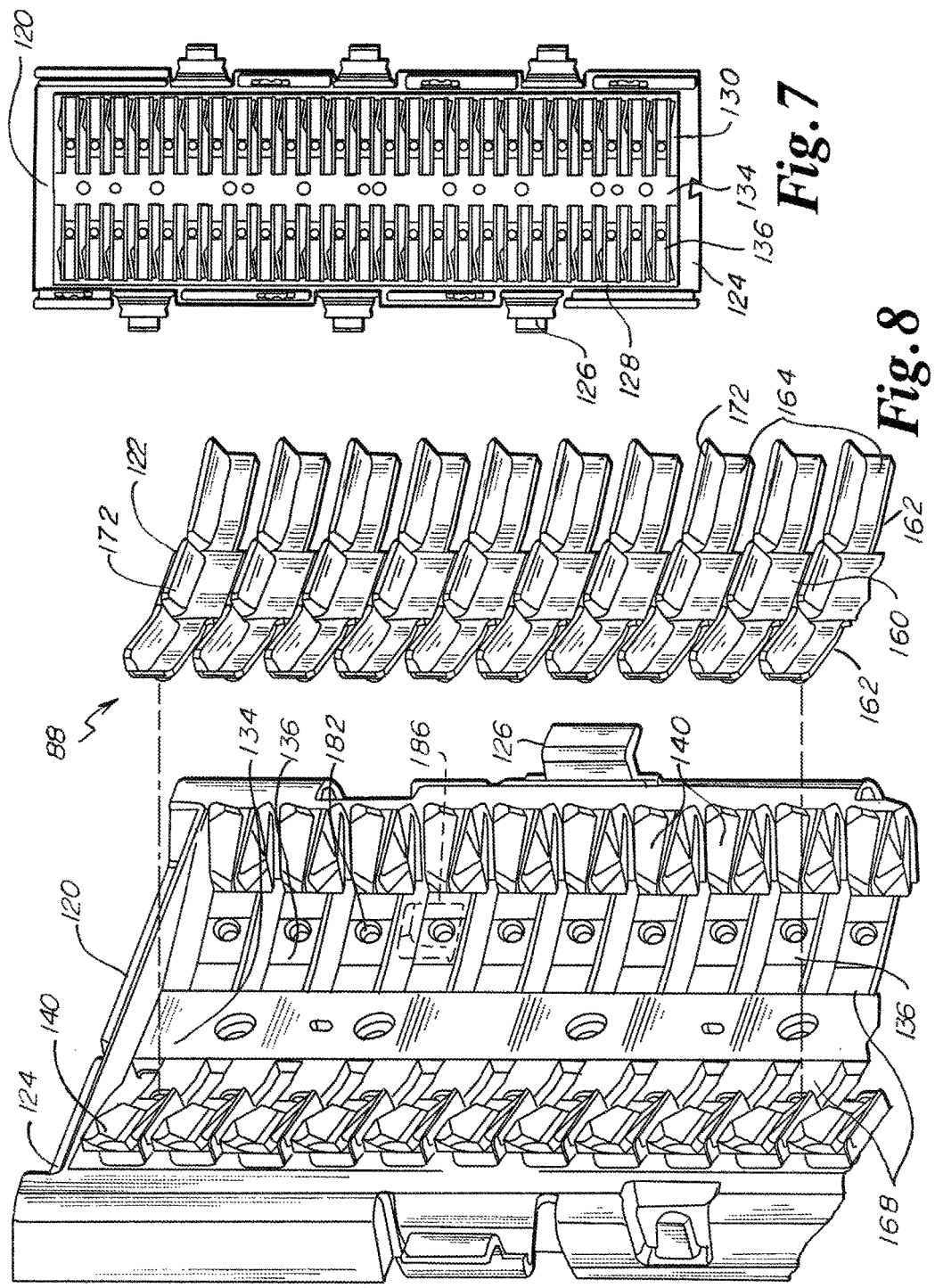
FIG. 7 is an elevational view of the backside, facing the door, of the wafer support of FIG. 1.
FIG. 8 is an exploded view of the wafer support system of FIG. 4.
Figure 9A:
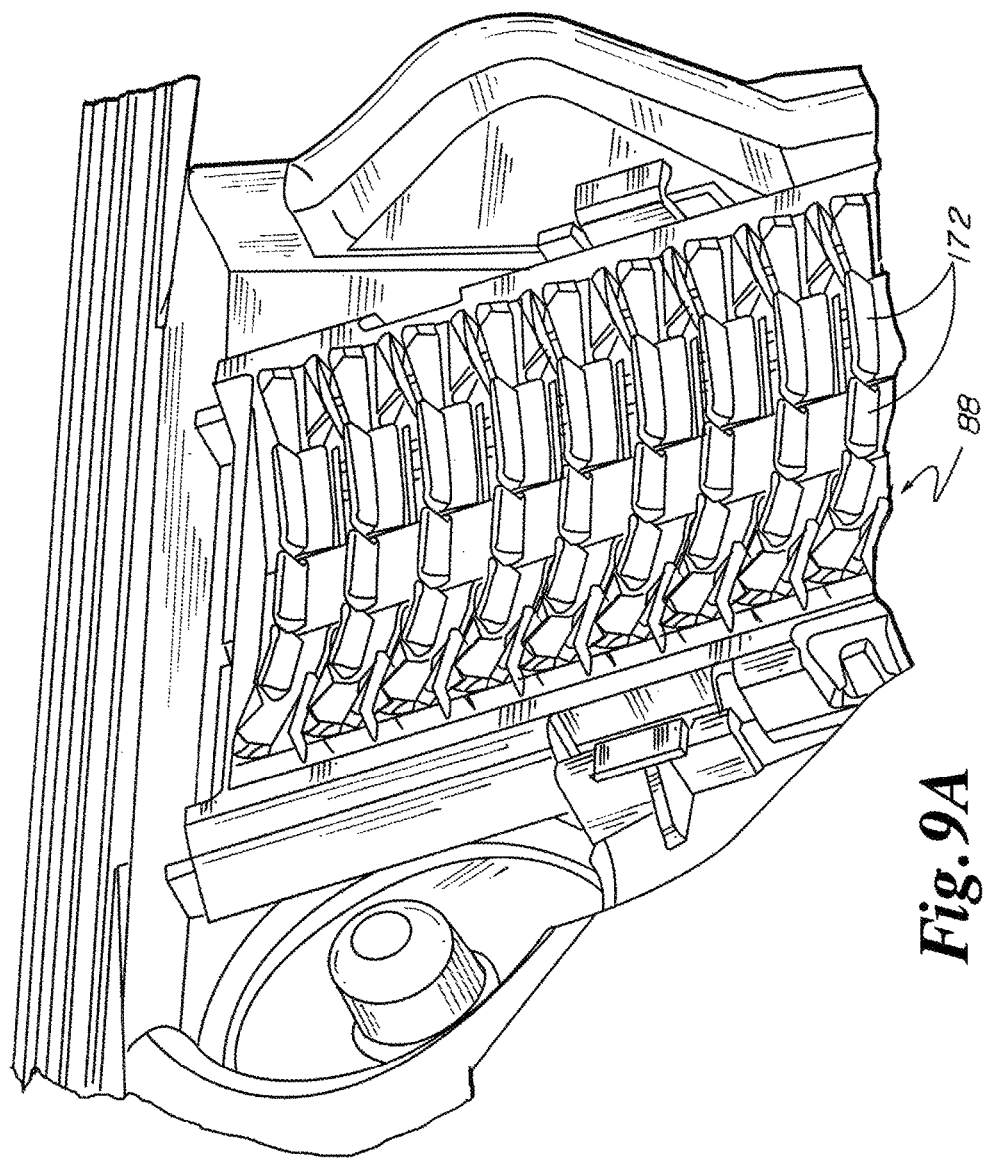
FIG. 9A is a detailed perspective view of the wafer support on the inside of the front door of the wafer container of FIG. 1.

Referring to FIGS. 1-6, a wafer container 20 generally comprises a container portion 30 and a door 32 defining an open interior 33 for holding wafers 34. The container portion has a door frame 36 defining an open front 38, A left side 42 a right side 44, a back side 45, a top side 46 and a bottom side 48, with respectively a left side wall 52, a right side wall 54, a top side wall 56, a back wall 57, and a bottom wall 58, each wall with respective inside facing surface and outside surface. The back wall 57 has feet 59 adjacent the top wall and bottom wall for seating the container on the back side after rotating the container 90 degrees, such as for transporting same.

The front door 32 has a pair of latch mechanism 60, 62, latch containments 63, and a seal 64 that encircles a periphery 66 of the door. The door has a chassis 68, an inside surface 70 and an outside surface 72.

Figure 11:
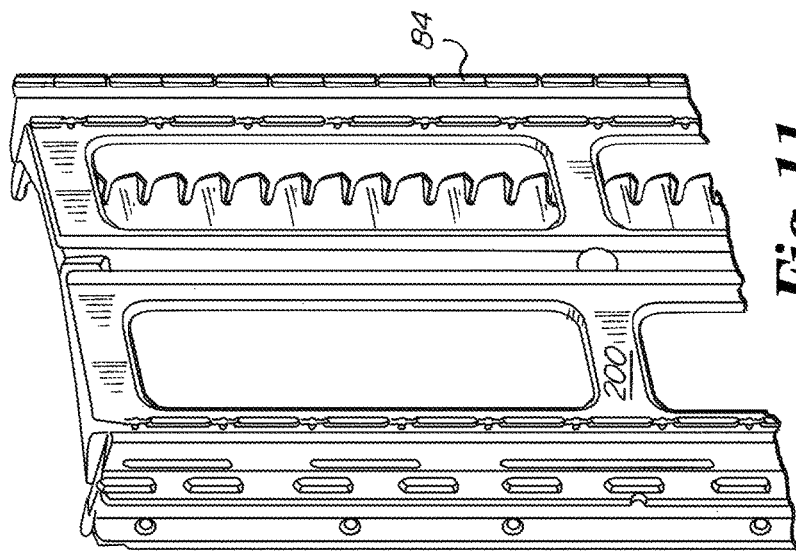
FIG. 11 is a perspective view of the back side of the wafer support of FIG. 10.
Figure 10:
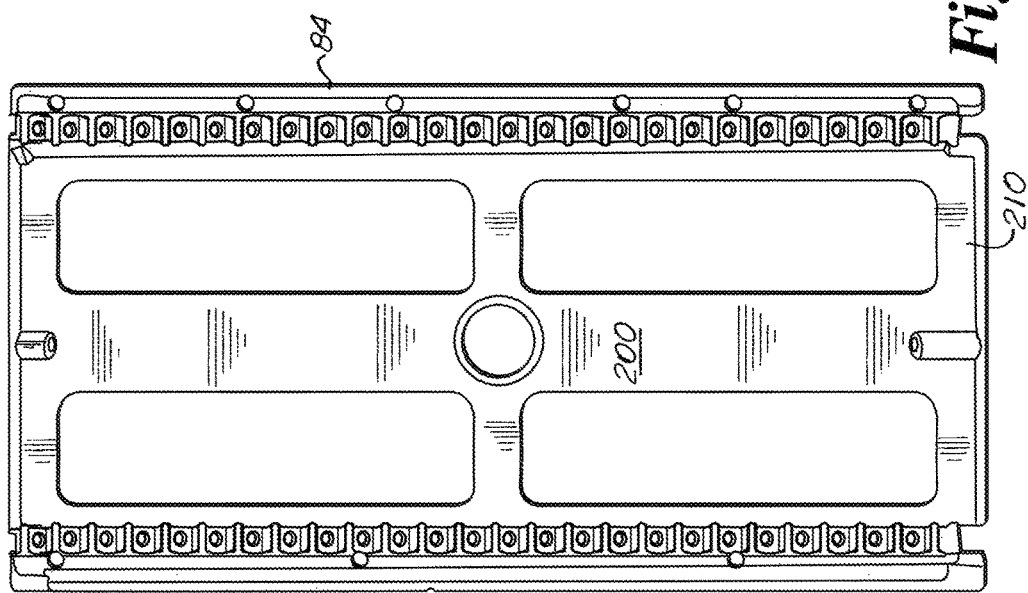
FIG. 10 is an elevational view of the rearward wafer support of FIG. 3.

The wafer container has wafer engagement features on in the container portion and on the inside surface of the front door. In the container portion, the wafers seat on wafer shelves 80 at the inside surfaces of the left and right side walls and engage a rearward wafer support system 82 with shock event protection feature 84. The rearward wafer support system cooperates with a forward wafer support system to compressively restrain the wafers therebetween such as is illustrated in U.S. Pat. No. 6,267,245; see FIG. 11B. This patent is owned by the owner of the instant application and is hereby incorporated herein by reference. The wafer container illustrated herein and in the '245 patent, falls within the FOSB category, an acronym for "front opening shipping box". These wafer containers are configured for receiving and transporting 300 mm wafers. The wafers may be received in the open front door, the door then attached and latched to the container portion, and then the container may be rotated rearwardly 90 degrees to orient the wafers vertically, such as shown in FIGS. 17 and 18. Similar wafer containers for 300 mm wafers that are used more exclusively in the fabrication facility setting, as opposed to shipping, are known as FOUPS, or front opening unified pods. The inventions disclosed may be suitable for use in FOUPS and may also be applicable to containers for other wafer sizes. For example, front opening wafer containers are also being developed for 450 mm wafers and the inventions herein will be suitable for incorporating in such containers.

Figure 20:
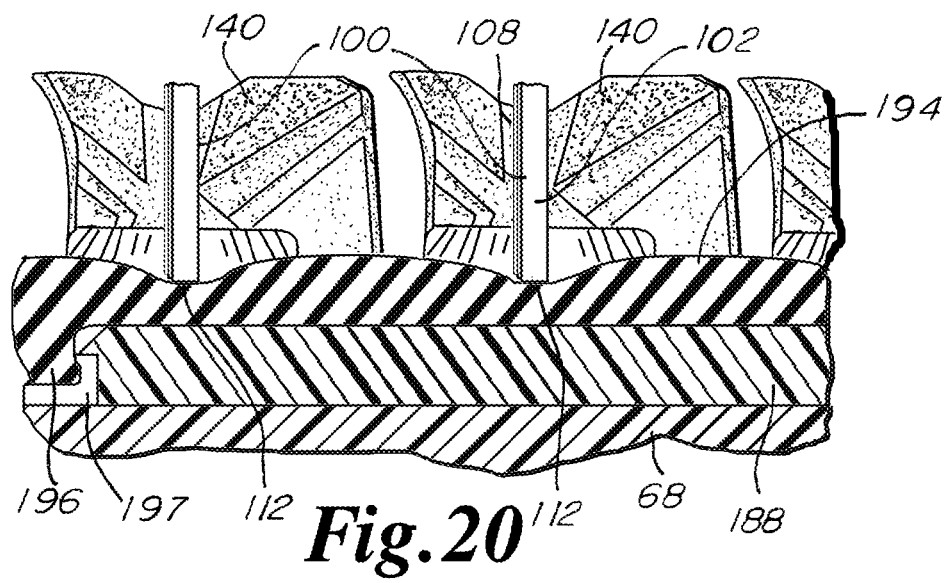
FIG. 20 is a cross sectional view of bonded wafer engagement with the wafer support of FIG. 19.
Figure 14:
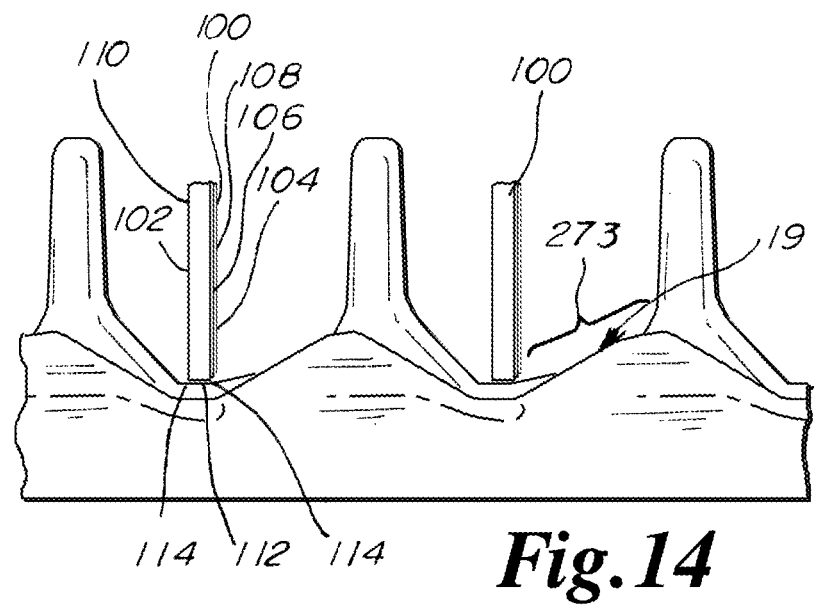
FIG. 14 is a side elevational view of a rearward wafer support system with shock feature suitable for bonded wafers.

In embodiments illustrated, each of the forward and rearward wafer supports may be provided with shock event protection and are particularly suitable for bonded wafers. Referring to FIGS. 14, 18, and 20, bonded wafers 100, have a carrier substrate 102, a thinned wafer 104, and an adhesion layer 106 that secures the thinned layer to the carrier substrate during processing. The bonded wafers have a thinned wafer side 108, a carrier substrate side 110, a wafer edge 112, and edge corners 114.

Details of forward wafer supports are provided in FIGS. 4-9D and 19A-20. Referring first to FIGS. 7-9D, the forward wafer support 88 has two components, a primary wafer support portion 120 and a secondary wafer support portion configured as a shock event wafer engagement cushion 122. The primary wafer support portion has a rectangular frame 124 with latching portions 126 on the long rails 128. A window 130 defined by the rectangular frame, frames central base strip 134 with opposing pairs of unitary cantilevered spring finger portions 136 extending outwardly toward the wafers and laterally toward the sides of the wafer container, each spring finger portion connecting and unitary with a wafer edge receiving portion 140 configured as a pad with a V-shaped recess 141 for receiving the edge of the wafer 100. The rectangular frame 124 engages elongate ribs 144 on the inside surface 70 of the door 32 and the central base strip 134 seats on the central attachment portion 146 configured as rib and structural projections and attached with nubs 152 engaging apertures 154 in the base strip. The base strip is attached at the top and bottom of the strip to the rectangular frame and the spring fingers and pads on the left side, when engaged with wafers in the container portion, provide a moment to the central base strip that is offset by the moment provided by the spring fingers and pads on the right side. Such balancing of the forces allows less structure to be used for supporting the compressive forces provided by the forward wafer support.

The shock event wafer engagement cushion 122 comprises a central strip 160 with a plurality of pairs 162 of arms 164 extending therefrom that correspond with each pair 168 of spring fingers and pads. Inwardly extending projections 172 are positioned axially and/or circumferentially offset from the primary seating positions 176. In embodiments, the primary wafer support portion 120 is formed of a more rigid polymer such as polycarbonate, nylon, or polyethylene, than the polymer of the shock event cushion 122 which may be a thermoplastic elastomer or other elastomeric material. The shock event cushion may be attached such as by the protrusions or nubs 180 that plug into apertures 182 in the primary wafer support portion 120. In other embodiments, individual discrete shock event cushions may be provided on the wafer supports for each wafer such as illustrated by the cushion 186 on FIG. 8. In other embodiments, the shock event cushion may be overmolded on the primary wafer support portion (or vice versa). The shock event cushion may be positioned to be engaged only upon a shock condition, that is, not engaged in a non-shock condition, or it may be positioned to be lesser engaged during a non-shock condition than during a shock condition. Or it may have a portion that is engaged in a normal non-shock condition and another portion that is engaged in a shock condition.

Figure 19A:
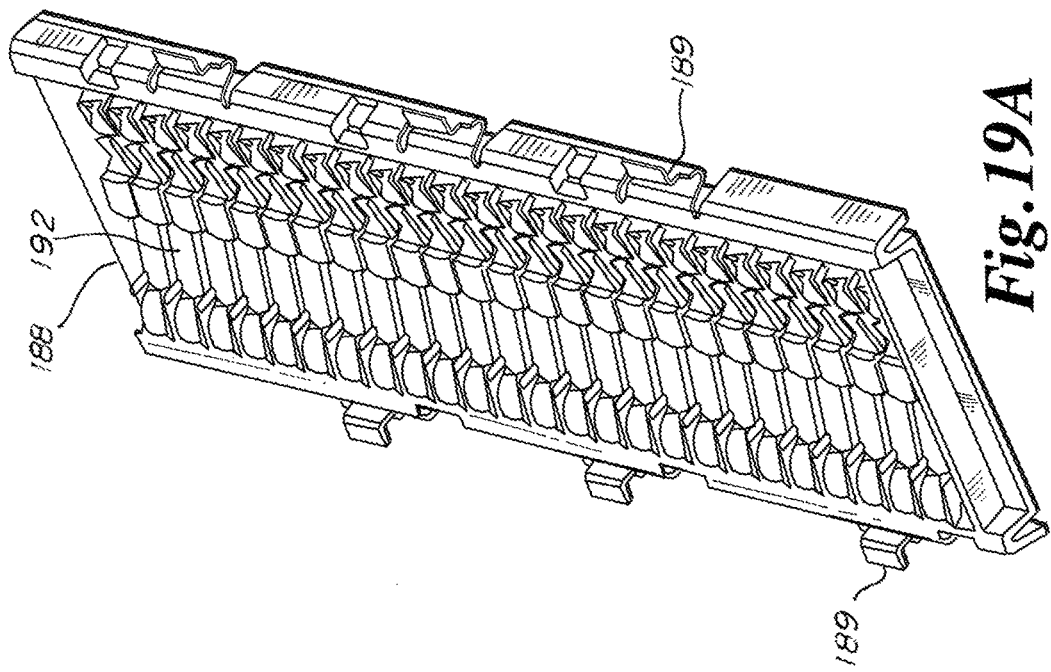
FIG. 19A is a perspective view of a forward wafer container that has a shock condition cushion with undulation extending down the center of a primary wafer support portion.
Figures 19B, 19C, 19D:
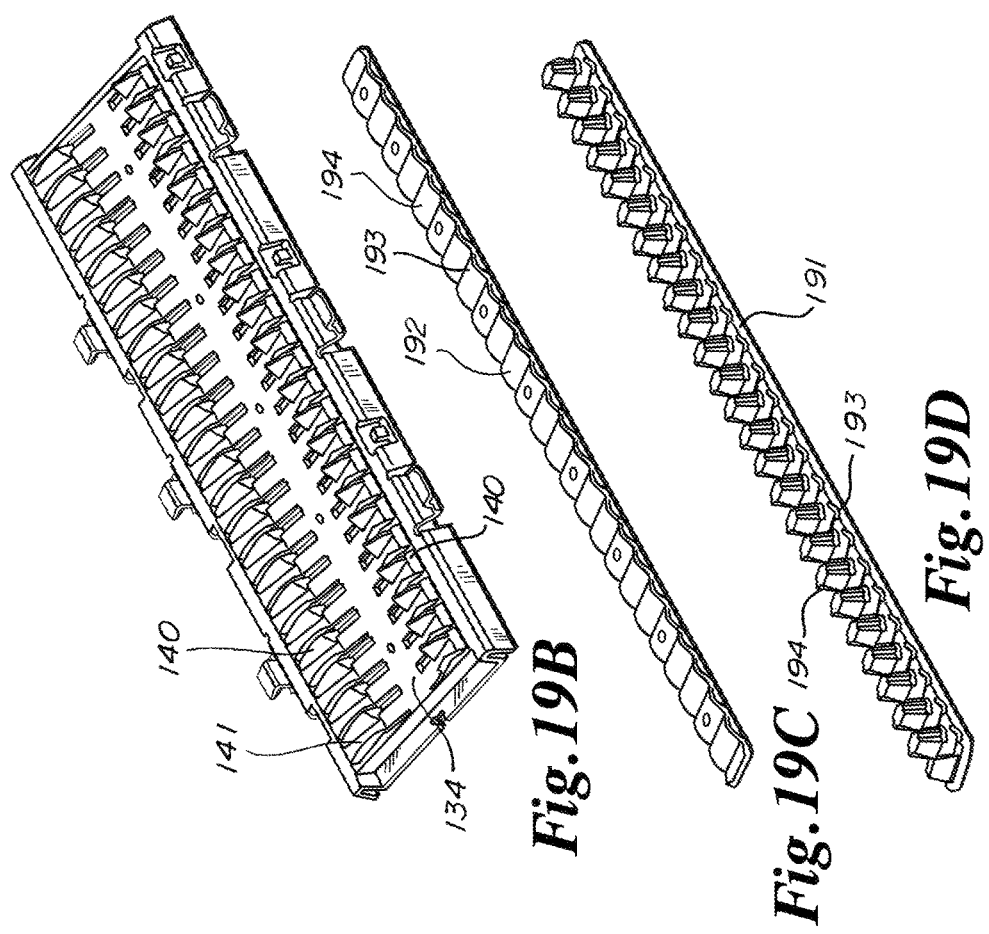
FIG. 19B is a perspective view of the primary wafer support portion of FIG. 19A without a secondary wafer support portion attached.
FIG. 19C is a perspective view of the elastomeric secondary wafer support portion of FIG. 19A.
FIG. 19D is a perspective view of another elastomeric secondary wafer support portion suitable for attachment to the primary wafer support portion of FIG. 19B.
Figure 19F:
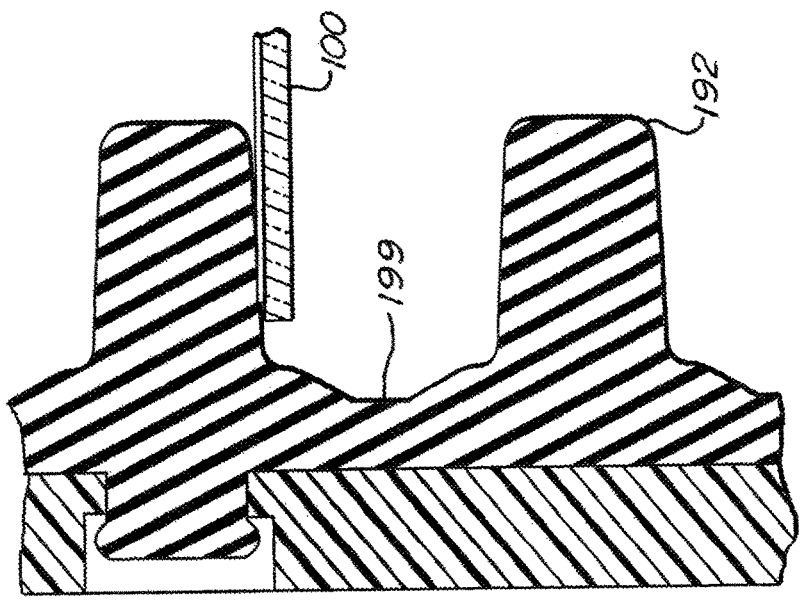
FIG. 19F is a cross sectional view of the secondary wafer support portion of FIG. 19D attached to a primary wafer support portion with the wafer in a shock condition with the thin wafer engaging the elastomeric shock engagement portion.
Figure 19E:
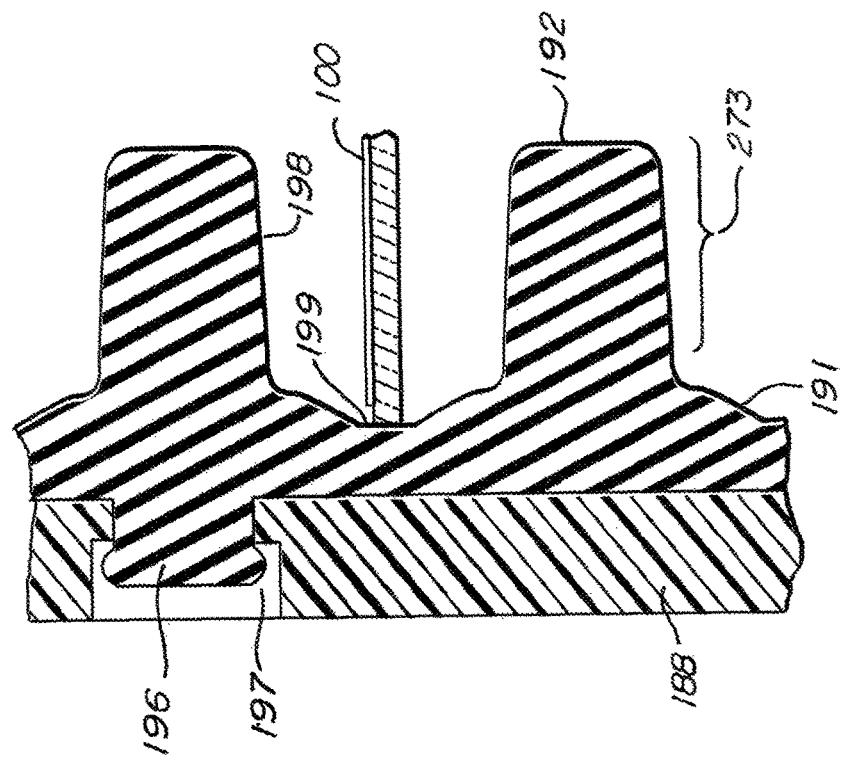
FIG. 19 E is a cross sectional view of the secondary wafer support portion of FIG. 19D attached to a primary wafer support portion with the wafer in a static condition (no-shock).

Referring to FIGS. 19A-20, a primary wafer support portion 188, has engagement structure 189 for attachment to the front door and has a secondary wafer support portion 192 configured as a shock condition cushion. FIG. 19D illustrates another embodiment of a secondary wafer support portion 191. The secondary wafer support portion may be a strip extending lengthwise on the primary wafer support portion with undulations 193 and with inward projections 194. Cooperating engagement structure such as nubs 196 of the secondary wafer support portion may be secured into apertures 197 in the primary wafer support portion. The wafer edge 112 may be engaging, slightly engaging, or spaced from the shock condition cushion during a non shock condition. The projections 194 may be positioned to engage the thinned wafer side 108 of the bonded wafer when in a shock condition thereby preventing the thinned wafer side from contacting other surfaces that would be more likely to damage the thinned wafer. FIG. 19E illustrates a bonded wafer in a static normal seating position in a recess 199 and a wafer deflection region 273. FIG. 19F illustrates a shock condition with the thinned wafer portion of the bonded wafer 100 engaging the projection 192 at a shock deflection contact region 198. In the shock condition, the wafer may or may not be still engaged with the pad. In embodiments, the secondary wafer support portion may be overmolded onto the primary wafer support portion.

Referring to FIGS. 3 and 10-14, embodiments of a rearward wafer support 82 are illustrated. The rear wafer support comprises a primary wafer support portion 200 and a shock event cushion 202. The primary wafer support portion has a rectangular framework 210, with rails 212 that snap-in or otherwise engage the back wall 57 for retaining the rearward wafer support attached thereto. The shock condition cushions may be a strip as illustrated in FIGS. 12 and 13 or may be discrete cushions position for each wafer. The shock condition cushion, like the forward shock condition cushion(s) may be engaged, partially engaged, or separated from the wafer edge in a non-shock condition. Upon a shock condition the engagement will be increased, or will occur. The shock condition cushion may be an elastomeric material or other material softer than the material of the primary rear wafer support. The materials are typically polymers.

Referring to FIGS. 13, 14, and 18, the rearward primary wafer support portion has a plurality of wafer edge engaging portions 222 that overall present a U-shape, see element 226, and have an internal V-shaped recess 228 that includes the non-shock seating position 232 for the wafer 102. The V-shaped recess has a pair of faces 238, 239 or legs 242, 244 in the cross section with a juncture 246 connecting the faces or legs. The juncture essentially defines the non-shock seating position of the wafers and has an apex 248. The angle 250 between the wafer and face 237 facing the carrier substrate side 110 of the wafer is less than the angle of the face 238 facing the thinned wafer side 108 and the wafer. Described in another way, the region 270, defined by the carrier substrate and the face of the V-shaped recess facing the carrier substrate is sharper or narrower towards the seating position compared to the region 272 defined by the thinned wafer and the face of the V-shaped recess facing the thinned wafer. A wafer deflection region 273 is defined where the edge of the wafer is anticipated to extend in a shock condition. As illustrated in other views, a shock condition cushion is suitably positioned to contact the wafer when the wafer extends into the wafer deflection region. The above configurations provide more clearance for the thinned wafer in a shock condition so that engagement of the thinned wafer with the primary wafer support portion is less likely. This configuration may also be provided to the springed pads 260 of the forward wafer supports, also shown in FIG. 18.

The wafer edge engagement portions 222 of the primary rearward wafer support have apertures 280 that may facilitate precisely molding the components and control of the interface between the thinned wafer and the wafer edge engagement portion. In embodiments, apertures may receive inserts that provide a shock condition cushion insert 283. Such may be molded and inserted or joined to the primary wafer support portion by an overmolding process. In embodiments, the shock condition cushion insert is a softer polymer material than the polymer material of the wafer edge engagement portion. Although the wafer edge engagement apertures are illustrated in the rearward wafer support, such may be used in the forward wafer support as well.

Referring to FIGS. 15-17, diagrammatic illustration of a front opening wafer container 300, has a container portion 302, a front door 304, wafer shelves 306 defining a wafer seating position 310, forward wafer supports 314 and rearward wafer supports 318. The forward wafer supports have a spring 320. In a horizontal position with the door open, the wafers 324 are seated on the shelves. When the door is latched to the open front 326, the wafers are elevated by the wafer engagement portions 330 of the wafer supports 314, 318 to the transport position 327 as shown in FIG. 16. The wafer container may be partially rotated to the position of FIG. 17 for transport. FIG. 17 illustrates a shock condition with a force impacting a lower corner of the container causing displacement of the wafers such that they engage the shock condition cushions 333. The shock condition cushion may be fixed to the wafer support or may be attached to the front door wall or back wall. The wafer 324 as illustrated may be a bonded wafer as described herein and with the thinned wafer side facing upward in FIGS. 15 and 16 and to the right in FIG. 17 such that the engagement in the shock condition is with the thinned wafer side.

Referring to FIGS. 21 and 22, embodiments of the invention may have shock condition cushions 350 on both sides of the primary non-shock seating position 353 of the wafer edge engagement portions 356. In a front loading wafer carrier, the wafer 360 may engage a lower ramp of the wafer engagement portion, ride up the ramp to the primary seating position 353 and upon complete closure of the door deflect the spring portion 364 and pad 366 such that the shock condition cushions 350 are exposed. In a shock condition, the shock condition cushions are available to protect the wafer, for example prevent disengagement with the wafer edge engagement portion and to provide shock absorption.

"Shock condition cushion portions" when used herein may refer to a discrete component or a part or section of a component. Shock condition cushions and portions may be formed of more than one polymer, for example a rigid polymer with a coating or overmolded portion of a softer and/or elastomeric polymer.

The above references in all sections of this application are herein incorporated by references in their entirety for all purposes. For purposes of interpreting the claims for the present invention, it is expressly intended that the provisions of Section 112, sixth paragraph of 35 U.S.C. are not to be invoked unless the specific terms "means for" or "step for" are recited in a claim All of the features disclosed in this specification (including the references incorporated by reference, including any accompanying claims, abstract and drawings), and/or all of the steps of any method or process so disclosed, may be combined in any combination, except combinations where at least some of such features and/or steps are mutually exclusive.

Each feature disclosed in this specification (including references incorporated by reference, any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment (s). The invention extends to any novel one, or any novel combination, of the features disclosed in this specification (including any incorporated by reference references, any accompanying claims, abstract and drawings), or to any novel one, or any novel combination, of the steps of any method or process so disclosed The above references in all sections of this application are herein incorporated by references in their entirety for all purposes.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative aspects. The above described aspects embodiments of the invention are merely descriptive of its principles and are not to be considered limiting. Further modifications of the invention herein disclosed will occur to those skilled in the respective arts and all such modifications are deemed to be within the scope of the invention.

The invention claimed is:

1. A wafer container for receiving and transporting bonded wafers, the wafer container comprising:
    a container portion including an open front defining an open interior and a back wall having an inside surface;
    a door that closes the open front defining the open interior, the door having an inside surface;
    a wafer support attached to one of the inside surface of the front door and the inside surface of the back wall of the, the wafer support having a plurality of pairs of wafer edge engagement portions having a first wafer edge engagement portion and a second wafer edge engagement portion, each wafer edge engagement portion defining a recess having a primary seating position, each of the wafer edge engagement portions comprised of a first polymeric material, wherein an edge of a wafer is in the primary seating position when the wafer container is not in a shock condition, the wafer support further including a shock deflection region axially offset from each primary seating position,
    each shock deflection region having a shock deflection contact portion positioned to contact a wafer when the wafer container is in a shock condition, wherein the shock deflection contact portion is comprised of a second polymeric material wherein the second polymeric material is softer than the first polymeric material of the wafer edge engagement portions.

2. The wafer container of claim 1 wherein the shock deflection contact region is positioned above the primary seating position.

3. The wafer container of claim 1 wherein each shock deflection region of wafer support is positioned inwardly into an interior of the container portion more than the portion of the wafer edge engagement portion at the primary seating position.

4. The wafer container of claim 1, wherein the second polymer is an elastomer.

5. The wafer container of claim 1, wherein the shock deflection contact region is centrally disposed between a plurality first and second wafer edge engagement portions forming at least a portion of the plurality of pairs of wafer edge engagement portions.

6. The wafer container of claim 1, wherein the shock deflection contact region extends along one of a plurality of first wafer edge engagement portions or second wafer edge engagement portions forming the plurality of pairs of wafer edge engagement portions.

7. The wafer container of claim 1, wherein the wafer support is attached to the inside surface of the door.

8. The wafer of claim 1, wherein the wafer support is attached to the inside surface of the back wall of the container portion.

9. The wafer container of claim 1, comprising a first wafer support attached to the inside surface of the door and a second wafer support attached to the inside surface of the back wall of the container portion.

* * * * *